US008278767B2

(12) United States Patent
Günther et al.

(10) Patent No.: US 8,278,767 B2
(45) Date of Patent: Oct. 2, 2012

(54) OPTOELECTRONIC COMPONENT

(75) Inventors: Ewald K. M. Günther, Regenstauf (DE); Siegfried Herrmann, Neukirchen (DE); Ulrich Zehnder, Rettenbach (DE); Herbert Brunner, Sinzing (DE)

(73) Assignee: OSRAM Opto Semiconductors GmbH (DE)

( * ) Notice: Subject to any disclaimer, the term of this patent is extended or adjusted under 35 U.S.C. 154(b) by 7 days.

(21) Appl. No.: 13/000,390

(22) PCT Filed: Aug. 4, 2009

(86) PCT No.: PCT/DE2009/001103
§ 371 (c)(1),
(2), (4) Date: Feb. 11, 2011

(87) PCT Pub. No.: WO2010/025694
PCT Pub. Date: Mar. 11, 2010

(65) Prior Publication Data
US 2011/0140284 A1 Jun. 16, 2011

(30) Foreign Application Priority Data
Sep. 3, 2008 (DE) .......................... 10 2008 045 653

(51) Int. Cl.
*H01L 23/52* (2006.01)
*H01L 23/48* (2006.01)
*H01L 29/40* (2006.01)

(52) U.S. Cl. ................. 257/777; 257/E23.018; 257/686; 257/723; 438/108; 438/109

(58) Field of Classification Search ........... 257/E23.018, 257/E23.141, E25.02, E21.211, E33.067, 257/88, 99, 685, 686, 723, 777, 778; 438/25, 438/27, 108, 109; 361/760
See application file for complete search history.

(56) References Cited

U.S. PATENT DOCUMENTS

| 6,757,314 | B2 * | 6/2004 | Kneissl et al. ............... 372/50.1 |
| 7,125,734 | B2 * | 10/2006 | Sackrison et al. ............... 438/25 |
| 8,154,040 | B2 * | 4/2012 | Sorg et al. ........................ 257/98 |
| 2005/0023550 | A1 * | 2/2005 | Eliashevich et al. ............ 257/99 |
| 2006/0180804 | A1 * | 8/2006 | Stauss et al. .................... 257/11 |
| 2007/0096115 | A1 | 5/2007 | Lee et al. ........................ 257/79 |
| 2007/0105212 | A1 | 5/2007 | Oldham et al. ............ 435/288.7 |
| 2007/0235863 | A1 | 10/2007 | Lee et al. ....................... 257/723 |
| 2009/0212307 | A1 | 8/2009 | Baur et al. ....................... 257/98 |
| 2010/0072500 | A1 | 3/2010 | Herrmann ........................ 257/98 |
| 2010/0073907 | A1 | 3/2010 | Wanninger et al. .......... 362/97.1 |
| 2010/0301355 | A1 * | 12/2010 | Wegleiter et al. ............... 257/88 |

FOREIGN PATENT DOCUMENTS

| DE | 10 2005 025 416 A1 | 12/2006 |
| DE | 10 2006 035 635 A1 | 2/2008 |
| DE | 10 2007 004 304 A1 | 7/2008 |
| DE | 10 2007 040 874 A1 | 3/2009 |
| DE | 10 2007 043 681 A1 | 3/2009 |
| WO | 2005/101489 A2 | 10/2005 |

* cited by examiner

*Primary Examiner* — Chris Chu
(74) *Attorney, Agent, or Firm* — DLA Piper LLP (US)

(57) ABSTRACT

An optoelectronic component includes a carrier with a mounting side and having at least one functional element, at least one substrateless optoelectronic semiconductor chip with a top and an opposed bottom and is electrically conductive by way of the top and the bottom, wherein the bottom faces the mounting side and the semiconductor chip is mounted on the mounting side, and at least one structured electrical contact film located on the top.

17 Claims, 4 Drawing Sheets

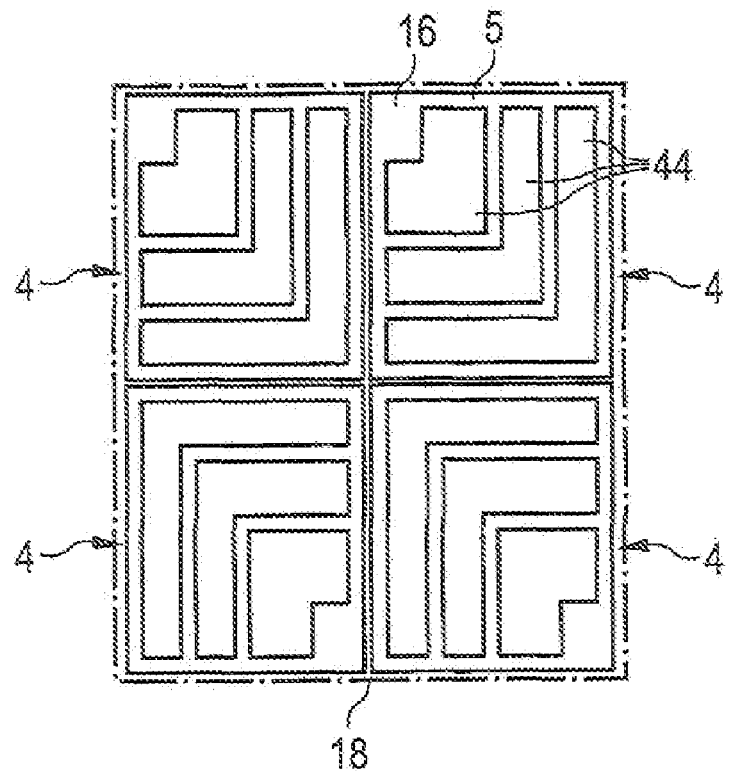
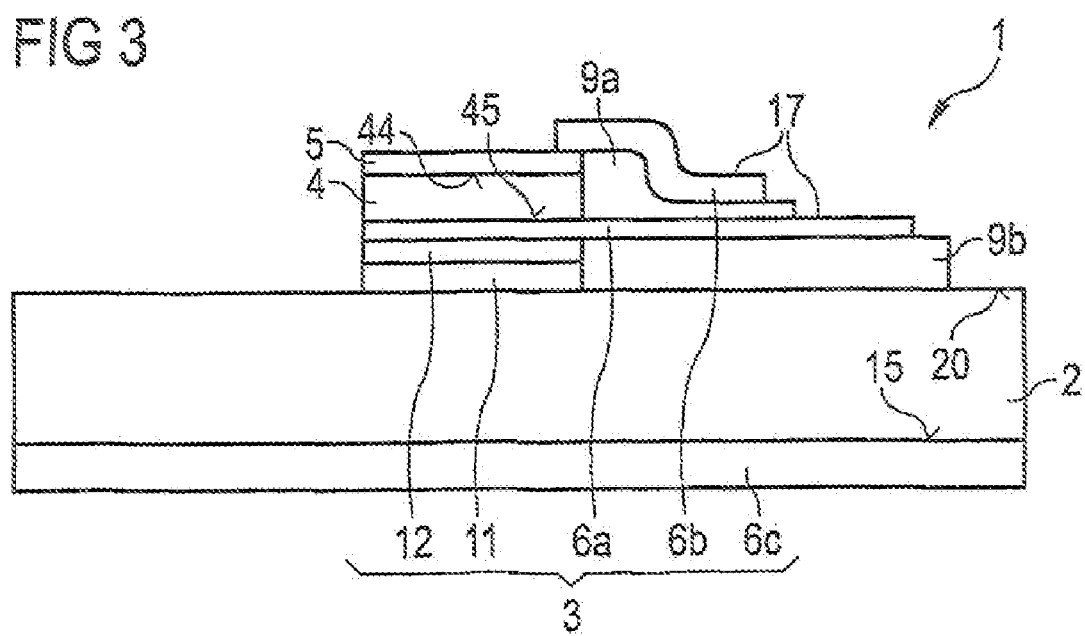

FIG 4
A)
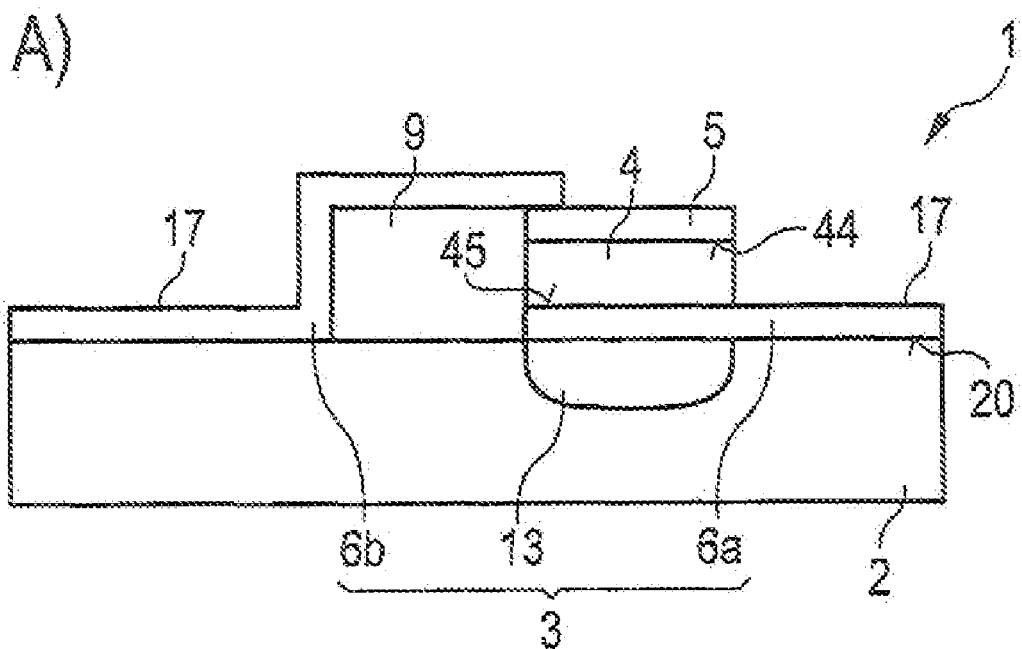
B)
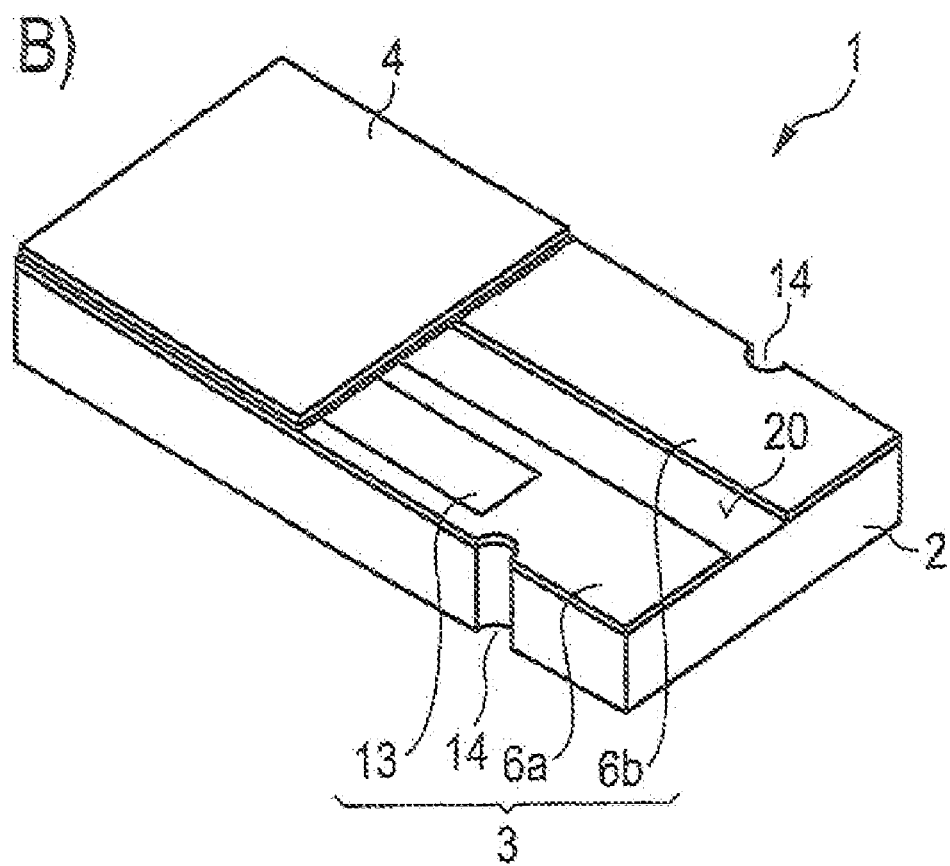

US 8,278,767 B2

OPTOELECTRONIC COMPONENT

RELATED APPLICATIONS

This is a §371 of International Application No. PCT/DE2009/001103 with an international filing date of Aug. 4, 2009 (WO 2010/025694 A9, published Mar. 11, 2010), which is based on German Patent Application No. 10 2008 045 653.5, filed Sep. 3, 2008, the subject matter of which hereby is incorporated by reference.

TECHNICAL FIELD

This disclosure relates to optoelectronic components.

BACKGROUND

Widespread industrial use is made of optoelectronic components such as for instance light-emitting diodes or photodiodes. Examples of the features which have encouraged the widespread use of such components are their high efficiency and long service life. Optoelectronic components may also be very compact and occupy only a small amount of space. To achieve high luminous intensities, however, it is often necessary to combine a plurality of optoelectronic semiconductor chips, for instance on a common carrier or substrate. This results in significant thermal loading of a component.

It could therefore be helpful to provide an optoelectronic component which has good thermal characteristics.

SUMMARY

We provide an optoelectronic component including a carrier with a mounting side and having at least one functional element, at least one substrateless optoelectronic semiconductor chip with a top and an opposed bottom and is electrically conductive by way of the top and the bottom, wherein the bottom faces the mounting side and the semiconductor chip is mounted on the mounting side, and at least one structured electrical contact film located on the top.

We also provide an optoelectronic component including a carrier with a mounting side and having at least one functional element, at least one substrateless optoelectronic semiconductor chip with a top and an opposed bottom and is electrically conductive by way of the top and the bottom, wherein the bottom faces the mounting side and the semiconductor chip is mounted on the mounting side, and at least one structured electrical contact film located on the top, wherein 1) the functional element is monolithically integrated with the carrier, 2) the functional element and the at least one semiconductor chip overlap in a direction parallel to the mounting side, and 3) the functional element is at least one selected from the group consisting of an electrostatic discharge protection, an electronic control unit, a sensor for temperature and/or radiation, and an active cooling element.

BRIEF DESCRIPTION OF THE DRAWINGS

FIG. 2 is a schematic plan view of contact films and the tops of an example of an optoelectronic component.

FIG. 3 is a schematic sectional representation of an example of an optoelectronic component with Peltier element.

FIG. 4 shows a schematic sectional representation (A) and a schematic three-dimensional representation (B) of an example of an optoelectronic component with ESD protection.

DETAILED DESCRIPTION

Figure 1:
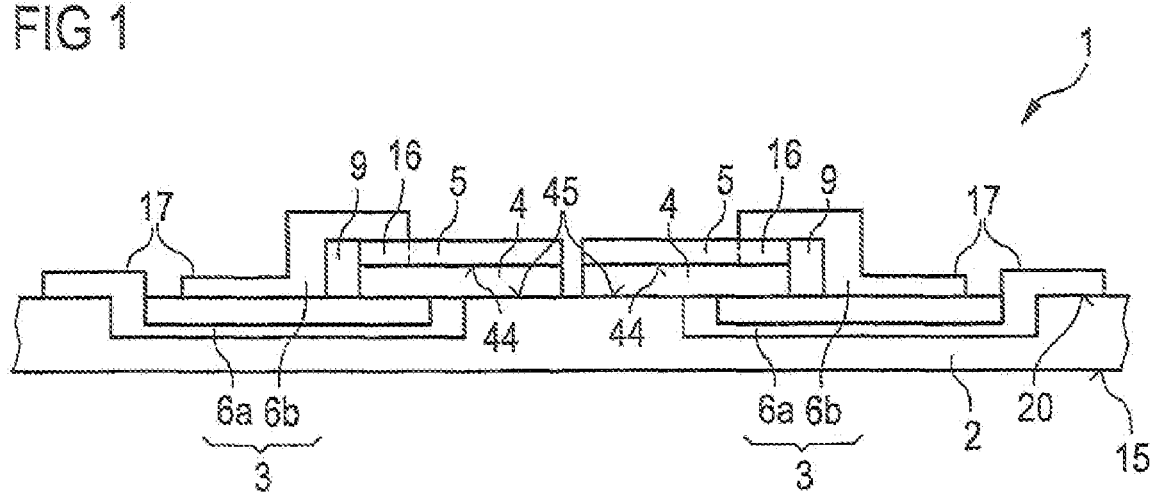
FIG. 1 is a schematic sectional representation of an example of an optoelectronic component.

Our optoelectronic components may comprise a carrier with a mounting side. The mounting side is formed by a major side of the carrier. The mounting side is preferably of planar configuration, but may also exhibit structuring. The carrier is made of a material with high thermal conductivity, which preferably amounts to at least 50 W/(m K), in particular at least 120 W/(m K). The carrier exhibits sufficient mechanical stability to prevent the carrier from bending and components mounted on the carrier from being damaged.

The carrier may comprise a functional element. By virtue of the functional element, the carrier exhibits at least one further function, which extends beyond mechanical stabilisation of components located on the carrier and/or common electrical contacting of a plurality of optoelectronic semiconductor chips, the functional element thus being actively electrically operable or comprising an electrical function. By way of the at least one functional element the characteristics of the carrier, in particular with regard to thermal and electrical aspects, may be effectively adapted to the requirements of a specific application.

The optoelectronic component may comprise at least one optoelectronic semiconductor chip. The optoelectronic semiconductor chip may take the form of a light-emitting diode, a luminescent diode, a laser diode or a photodiode. In particular, the semiconductor chip is a receiving or transmitting element for electromagnetic radiation.

The optoelectronic semiconductor chip may be a substrateless semiconductor chip. Substrateless means that layers with at least one active region are grown, for example, epitaxially on a growth substrate. Such a semiconductor chip and a method for the production thereof is disclosed in document DE 10 2007 004 304 A1, the subject matter of which, with regard to the semiconductor chip and the production method for such a semiconductor chip, is hereby incorporated by reference.

The substrateless semiconductor chip may exhibit a thickness of less than 100 μm, preferably of less than 50 μm. In particular, the thickness of the semiconductor chip is less than 10 μm.

The semiconductor chip may comprise a top and a bottom opposite thereto. Top and bottom are formed of major sides of the semiconductor chip.

The optoelectronic semiconductor chip may comprise electrical contacting means on the top and the bottom. In other words, the electrical contact points of the semiconductor chip are located on mutually opposing sides. In particular, the semiconductor chip is not a "flip chip".

The optoelectronic semiconductor chip may be placed on the mounting side. In particular, the semiconductor chip is attached directly to the mounting side. This does not rule out a bonding agent such as an adhesive or a solder being located between the semiconductor chip and the mounting side. Additionally or as an alternative, the semiconductor chip may be placed directly on the at least one functional element, which is for instance integrated into the carrier.

The optoelectronic component may comprise at least one electrical contact film. The contact film is preferably made of a metal. The contact film may likewise be made of a transparent material, for example, from the group of transparent conductive oxides, "TCOs" for short, specifically from indium-tin oxide.

The contact film may be structured. This means that the contact film constitutes conductive tracks on the surface of the semiconductor chip. The structured contact film may be applied by vapor deposition. The contact film is preferably structured lithographically. For example, the contact film comprises a plurality of L-shaped sub-zones, which are enclosed in the manner of a frame by a further sub-zone, the L-shaped sub-zones having leg lengths wherein the leg lengths of different sub-zones differ from one another.

The contact film may be placed on the top of the optoelectronic semiconductor chip. The contact film thus serves in electrical contacting of the semiconductor chip. The structuring of the contact film is preferably such that only a small proportion of the area of the top of the semiconductor chip is covered by the contact film, in particular less than 35%, preferably less than 20%.

The optoelectronic component may comprise a carrier with a mounting side and with at least one functional element. In addition, the optoelectronic component may comprise at least one substrateless optoelectronic semiconductor chip with a top and a bottom opposite thereto, electrical contacting of the semiconductor chip taking place by way of the top and the bottom, and the bottom facing the mounting side of the carrier. The at least one semiconductor chip is placed on the mounting side. Furthermore, the optoelectronic component contains at least one electrical contact film on the top of the semiconductor chip, the contact film being structured.

Such an optoelectronic component is of compact construction and exhibits good thermal properties.

The carrier may exhibit a thickness in the range between 30 µm and 1 mm, in particular a thickness in the range between 50 µm and 100 µm. Such a small carrier thickness ensures that the carrier exhibits low thermal resistance, i.e. when the optoelectronic component is in operation heat arising in the semiconductor chip may be dissipated efficiently out of the component via the carrier.

The at least one semiconductor chip may comprise a metallic electroplating layer at least in places on at least one major side. The thickness of the electroplating layer, in a direction perpendicular to the major side of the semiconductor chip, may exceed 2 µm. The electroplating layer is preferably applied to the bottom of the semiconductor chip.

The optoelectronic component may comprise a plurality of semiconductor chips. A plurality means that the component comprises at least two, in particular at least four, preferably at least eight semiconductor chips. By using a plurality of semiconductor chips it is possible to obtain a highly luminous light source.

The semiconductor chips may be densely packed at least in a region of the mounting side of the carrier which comprises at least two semiconductor chips. The region preferably comprises at least four semiconductor chips, preferably at least half of, in particular all of the semiconductor chips mounted on the carrier. "Densely packed" may mean that the semiconductor chips cover at least 60% of the area of the mounting side in this region. In particular, the semiconductor chips may cover more than 80%, preferably more than 90%, of the area of the mounting side in this region. A high packing density of semiconductor chips results in a particularly intense light source, which may also exhibit a high level of brightness. Because the semiconductor chips are substrateless and the carrier is preferably thin and exhibits high thermal conductivity, the heat arising when the semiconductor chips are in operation may be readily dissipated. The low thermal resistance of the semiconductor chips and of the carrier enables dense packing of a plurality of semiconductor chips.

The at least one functional element and at least one semiconductor chip may overlap in a direction parallel to the mounting side. In other words, if the functional element and semiconductor chip are projected onto the mounting side, the projected areas of functional element and semiconductor chip overlap. This overlap enables a dense arrangement of the semiconductor chips and thus a compact structure of the optoelectronic component. Through such an overlap of functional elements and semiconductor chips, the thermal resistance of the carrier may also be reduced if the material of the functional element has a higher thermal conductivity than the carrier.

The functional element may be integrated in or on the carrier. This means that the functional element is constructed monolithically or in one piece with the carrier. This may mean, in particular, that the functional element is located wholly or partially between the mounting side and a major surface of the carrier on the opposite side from the mounting side. Preferably, the functional element is located predominantly, i.e. to an extent of at least 80% with regard to the volume occupied by the functional element, between the mounting side and the major side of the carrier opposite the mounting side. The functional element may also be integrated on the carrier, i.e. the functional element is in direct physical contact with the carrier. The functional element is in particular joined firmly, i.e. irreversibly, to the carrier. Irreversibly means that the functional element cannot be removed and joined on again by plugging in or a plug-in connection and not without the assistance of tools. A soldered joint or adhesive bond is also irreversible. It is possible for the functionality of the carrier to be destroyed when the functional element is removed. By integrating the functional element in or on the carrier the space required by the component is reduced. The functional element is also in direct, thermal contact with the carrier.

The functional element may comprise electrical conductors such that the semiconductor chips are individually electronically drivable, i.e. each semiconductor chip may be supplied with current separately and independently of other semiconductor chips. In this way, a component may be obtained which, depending on specific requirements, may emit light in a targeted manner. Through the separate drivability of the semiconductor chips, thermal loading may also be reduced, since semiconductor chips which are not needed, for example in a lighting device, may be switched off or dimmed.

One functional element may be assigned, in particular uniquely, to each semiconductor chip. The functional element may, at least in part, be located on the bottom of the semiconductor chip. Such an arrangement of the functional elements makes it possible to achieve a compact structure for the component.

The semiconductor chips may be arranged in at least two groups. Semiconductor chips which emit in the same spectral range or are placed in different regions on the mounting side may for example be combined into groups. Like individual semiconductor chips, individual groups may also be electrically individually drivable by an appropriately configured functional element. Individual groups of semiconductor chips may in this way be operated efficiently and in targeted manner such that the electrical power consumption of the component may be reduced, the thermal loading thus also being reduced.

The carrier and/or the functional element may be made of a semiconductor material or a ceramic.

The functional element may take the form of an active heat sink. For example, the functional element is a Peltier element, which may be integrated monolithically into the carrier. Alternatively, the functional element may take the form of a fan or cooling circuit, for example with a cooling liquid. Heat from the optoelectronic component may be dissipated particularly efficiently by such a functional element.

The functional element may take the form of protection against electrostatic discharge. In other words, the functional element acts as ESD protection. ESD protection provides the component with protection against short circuits, which may be caused by an electrostatic discharge and may lead to destruction for instance of an individual semiconductor chip. The functional element is, for example, a varistor, a varistor ceramic, a resistor or a Schottky diode. The functional element is for instance connected electrically in parallel with the semiconductor chip. Short circuits may also result in very high currents. This may result in significant thermal loading of the component, whereby other components, in addition to the one exhibiting the short circuit, may also be destroyed. This may be prevented by ESD protection.

The functional element may be monolithically integrated into the carrier. The carrier is then for example made of p-doped silicon. The functional element comprises at least one n-doped zone. In this way, at least one pn-junction is produced by the functional element, in conjunction with the carrier. It is likewise possible for the carrier to be n-doped. In this case the functional element comprises at least one p-doped zone. Such a functional element may be space-savingly configured, for instance as a diode or transistor.

The functional element may take the form of an electronic control unit. By way of the electronic control unit, the supply of current to individual semiconductor chips may for example be separately controlled. As a result of the separate drivability, a semiconductor chip may for example be dimmed. In this way, the electrical power consumption of the component may be reduced, so reducing thermal loading.

The carrier may be formed by the functional element. For example, the functional element comprises a silicon-based chip, which comprises integrated circuits which are configured for instance as an electronic control unit. At least one optoelectronic semiconductor chip or one light-emitting diode is then placed on this chip.

The functional element may comprise at least one temperature and/or radiation sensor. The sensor may take the form of a temperature-dependent resistor or a photodiode. If the sensor is a temperature sensor, the latter is preferably in thermal contact with the at least one semiconductor chip. If the sensor is a radiation sensor, the radiation of the light-emitting diode chips or external radiation not coming from the component may be detected. The component may for example be protected from thermal overload by such sensors.

The functional element may be an addressing unit. The semiconductor chips are then addressable and/or assignable by the functional element. For example, by the at least one functional element, a unique address is assigned to each of the semiconductor chips or groups of semiconductor chips, by which the semiconductor chip or the group may be driven in targeted manner.

The electronic control unit may be connected to at least one sensor by way of at least one signal line. The signal from the sensor is fed into the electronic control unit. Control of current flow by the at least one optoelectronic semiconductor chip proceeds at least on the basis of the sensor signal. The electronic control unit may, for example, depending on the temperature of the component, switch off individual ones or indeed all of the component's optoelectronic semiconductor chips. This prevents the optoelectronic component from being exposed to excessive thermal loading. If the sensors are radiation sensors, the current supplied to the optoelectronic component may be adjusted for example as a function of external radiation. In the event of low external radiation such as in a dark environment, the current intensity may be increased by way of the electronic control unit. Such an electronic control unit results in the component being supplied with current as required and reduces the thermal loading thereof. This also increases the service life of the component.

The carrier may be surface mounted, i.e. the carrier may be connected by way of Surface Mount Technology, or "SMT" for short, to an external connection carrier which is not part of the component. This involves the component withstanding the temperatures arising during SMT contacting without being destroyed. The carrier may thus be soldered in particular to a connection carrier. The solder contacts may be of large-area configuration. The solder contacts may be made of a metal. A metallic and/or large-area embodiment of solder contacts may ensure good thermal contact between the component and an external connection carrier. This improves the thermal characteristics of the arrangement.

The electrical power consumption of the at least one semiconductor chip, relative to the area of the top of the semiconductor chip, may be at least 1 W/mm$^2$. In particular, the electrical power consumption amounts to at least 5 W/mm$^2$. Such electrical power densities enable an intensely emitting light source to be achieved with the optoelectronic component, for instance. Use of substrateless semiconductor chips and a thin carrier with elevated thermal conductivity and/or in conjunction with a functional element configured as an active or passive cooling unit allows the thermal loads resulting from high electrical power consumption to be dealt with.

The at least one semiconductor chip may be soldered or adhesively bonded to the carrier and/or to the functional element. By soldering or adhesive bonding, large-area contact may be achieved between the semiconductor chip and the carrier and/or the functional element. In this way good thermal contact is ensured between semiconductor chip and carrier and/or functional element.

The functional element may comprise electrical conductors, which extend substantially inside the carrier. "Substantially" here means that the electrical conductors extend inside the carrier apart from connection points with which the electrical conductors may be contacted. Such electrical conductors reduce the risk of short circuits. At the same time, large-area, in particular metallic contact surfaces may be used for contacting of the semiconductor chip. Large-area electrical contacts in turn lead to improved thermal contact between the optoelectronic semiconductor chip and for instance the carrier.

Some of the fields of application in which optoelectronic components described herein may be used are for instance the backlighting of displays or display means. Furthermore, the optoelectronic components described herein may also be used in lighting devices for projection purposes, in floodlights, automotive headlights or spotlights or in light sources for general lighting purposes.

A component described herein will be explained in greater detail below with reference to the drawings and with the aid of examples. Identical or identically acting elements illustrated in the individual figures are here indicated with the same reference numerals. The relationships between the elements are not shown to scale, however, but rather individual elements may be shown exaggeratedly large to assist in understanding.

Turning now to the drawings, FIG. 1 shows an example of an optoelectronic component 1. A carrier 2 comprises a mounting side 20, on which optoelectronic semiconductor chips 4 have been soldered. The semiconductor chips 4 are substrateless semiconductor chips. The semiconductor chips 4 comprise a top 44 and a bottom 45 opposite the top 44. The bottom 45 faces the mounting side 20. A metallic contact film 5 is applied to the top 44. The contact film 5 ensures uniform current infeed into the semiconductor chips 4 over the entire surface 44 thereof. At edge regions of the semiconductor chips 4 there are located contact points 16 for electrical contacting.

Electrical conductors 6a, 6b form a functional element 3. The semiconductor chips 4 may be individually electrically actuated by the functional element 3. The electrical conductor 6a contacts the bottom 45. From the bottom 45 the electrical conductor 6a extends inside the carrier 2. In a peripheral zone of the carrier 2 the electrical conductor 6a passes to the mounting side 20 and there forms an electrical connection point 17. The electrical conductor 6b is connected electrically conductively via the contact points 16 to the contact film 5 on the top 44. The electrical conductor 6b extends from the contact film 5 to the mounting side 20 of the carrier 2. To avoid electrical short circuits, side faces of the semiconductor chips 4 are provided with an insulator 9. The insulator 9 is formed for example of a varnish. The thickness of the insulator 9 in a direction perpendicular to the mounting surface 20 corresponds at least to the height of the semiconductor chip 4, but may also project beyond the height thereof by up to a factor of 5. Unevennesses caused by the insulator 9 may be bridged by the electrical conductor 6b, without the electrical conductor 6b being interrupted. The end of the electrical conductor 6b located on the mounting side 20 constitutes a connection point 17.

Contrary to what is shown in FIG. 1, the electrical conductors 6a, 6b may also extend to a carrier bottom 15 opposite the mounting side 20. The electrical connection points 17 formed by the ends of the electrical conductor 6a may be of large-area construction to ensure good thermal contact by adhesive bonding or soldering to an external connection carrier not shown and not constituting part of the component 1. By such a connection and by making the carrier 2 thin, good thermal coupling is obtained between the semiconductor chips 4 and the external connection carrier, not shown.

It is likewise possible, contrary to what is shown in FIG. 1, for all the connection points 17 to be concentrated in a small area on the carrier 2. In particular, all the connection points 17 may be arranged in a row or in a double row along one edge of the carrier 2.

The semiconductor chips 4 are located close together in a direction parallel to the mounting side 20. Since FIG. 1 is a sectional representation, only two semiconductor chips 4 are visible. Two rows of semiconductor chips 4 may also be mounted on the mounting side 20. It is likewise possible for a plurality of rows, in particular double rows, to be mounted with lateral offset on the carrier 2.

FIG. 2 shows a plan view of the tops 44 of the semiconductor chips 4. A contact film 5 is applied to each top 44. The contact films 5 cover only a small proportion of the area of the tops 44. The contact film 5 has strip-like structuring. The structuring forms rectangular or L-shaped fields on the surface 44. In this way, uniform current infeed into the semiconductor chips 4 is achieved.

In one corner of the tops 44 there is in each case located one of the contact points 16. The contact films 5 are connected electrically with the electrical conductors 6b via the contact point 16. The connection may be brought about by soldering.

The strip-like parts of the contact film 5 which are located close to the contact point 16 may be wider than strip-like zones of the contact film 5 located further away from the contact point 16. This results in more uniform current input into the semiconductor chip 4.

According to FIG. 2, four semiconductor chips 4 are arranged in a densely packed manner. The distance between neighboring semiconductor chips 4 is less than the lateral extent of the semiconductor chips 4. The proportion of the area within a region 18 which is covered by the chip tops 44 relative to the mounting side 20 on which the semiconductor chips 4 are placed amounts to around 95%. The region 18 comprises the semiconductor chips 4 and is framed by a broken line in FIG. 2. This compact arrangement of semiconductor chips 4 is made possible by the fact that the semiconductor chips 4 are substrateless chips which are placed directly on the carrier 2, so enabling good dissipation of the heat arising when the semiconductor chips 4 are in operation.

In the example according to FIG. 3 the functional element 3 takes the form of a Peltier element. Between the bottom 45 of the semiconductor chip 4 and the mounting side 20 of the carrier 2 there are mounted a metal film 12 and a layer 11 of a highly doped semiconductor material. The carrier 2 made of silicon is p-doped, the layer 11 highly p-doped. Electrical conductors 6a, 6b serve for electrical contacting of the semiconductor chip 4. The electrical conductor 6b is configured in accordance with the example according to FIG. 1. The electrical conductor 6a extends laterally into peripheral zones of the carrier 2 and forms one of the connection points 17.

To avoid electrical short circuits the electrical conductors 6a, 6b are insulated from one another and in the direction of the carrier 2 by insulators 9a, 9b. The insulators 9a, 9b may take the form of varnishes.

Furthermore, an electrical conductor 6c is applied over a large area of the carrier bottom 15.

When the component 1 is in operation, the electrical conductor 6b is connected as the anode. The electrical conductors 6a, 6c serve as the cathode. Thus, in operation, current flows on the one hand via the electrical conductor 6a through the semiconductor chip 4 and via the electrical conductor 6b. On the other hand, current flows via the conductor 6a through the metal film 12, the highly p-doped layer 11 and the carrier 2 to the electrical conductor 6c. This means that at the boundary surface between the metal film 12 and the highly p-doped semiconductor layer 11 cooling takes place due to the Peltier effect, while at the boundary surface between the carrier 2 and the electrical conductor 6c heating takes place. The semiconductor chip 4 is thus cooled and the carrier bottom 15 is heated. Since the electrical conductor 6c is of large-area configuration, local cooling takes place at the semiconductor chip 4 and large-area, and thus less significant, heating takes place at the carrier bottom 15. The carrier bottom 15 and the large-area electrical conductor 6c make it optionally possible for the heat to be dissipated from the component 1 via an external connection carrier, not shown, as a result of the Peltier effect and as a result of operation of the semiconductor chip 4.

The intensity of the Peltier effect and thus the cooling of the semiconductor chip 4 may be adjusted by way of the voltage between electrical conductor 6a and electrical conductor 6c.

Contrary to what is shown in FIG. 3, it is not necessary for the metal film 12 and in particular the highly p-doped layer 11 to extend over the entire bottom 45 of the semiconductor chip. Punctiform, and thus more intense cooling is also possible by way of a structured layer 11. The metal film 12 takes the form for example of a gold film. The metal film 12 may thus serve as a reflector for radiation generated for example in the semiconductor chip 4.

FIG. 4 shows an example in which the functional element 3 takes the form of an ESD protection. P-doped silicon serves as the carrier 2. The carrier 2 comprises an n-doped zone 13. This is located on the mounting side 20 at the point where the semiconductor chip 4 is placed on the carrier 2. The electrical conductor 6b serves as the cathode when the component 1 is in operation, while the electrical conductor 6a serves as the anode. The semiconductor chip 4 is mounted accordingly, i.e. the p-side of the semiconductor chip 4 faces the mounting side 20. If an electrostatic voltage of the opposite pole from the operating voltage thus builds up outside operation of the semiconductor component 1, this may flow away via the carrier 2 and the n-doped zone 13 and the electrical conductors 6a, 6b. This prevents destruction of the component.

FIG. 4B is a three-dimensional schematic representation of the optoelectronic component 1 according to FIG. 4A. The carrier 2 may comprise adjusting devices 14 in the form of recesses, which simplify precise mounting on an external connection carrier which is not shown and does not constitute part of the component 1.

Figure 5:
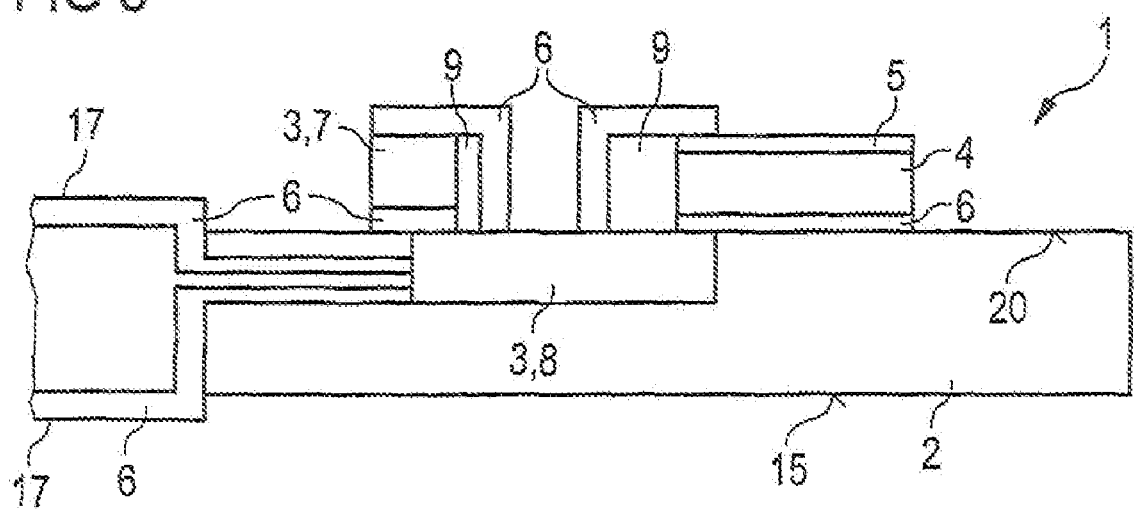
FIG. 5 is a schematic sectional representation of a further example of an optoelectronic component.

In the example according to FIG. 5 the functional element 3 takes the form of an electronic control unit 8. The electronic control unit 8 is connected via electrical conductors 6 to a temperature sensor 7 and to the semiconductor chip 4. The semiconductor chip 4 may be supplied with current via the electronic control unit 8, as a function of a signal from the temperature sensor 7. Thermal overloading of the optoelectronic component 1 is thus prevented by suitable control.

Contrary to what is shown in FIG. 5, a plurality of semiconductor chips 4 may also be placed on the carrier 2. The different semiconductor chips 4 may be driven by way of a single electronic control unit 8 and a single temperature sensor 7 or indeed by way of a plurality of temperature sensors 7 or electronic control units 8. To supply current to the electronic control unit 8 electrical conductors 6 are present in the carrier 2 and extend at lateral peripheral zones of the carrier 2 to the mounting side 20 and to the carrier bottom 15. The end zones of these conductors 6 may take the form of connection points 17. Contacting of an external connection carrier, not shown, is possible for example by way of soldering, adhesive bonding and/or bonding wires.

An electronic control unit according to FIG. 5 may also be combined with a Peltier element, for example as illustrated in FIG. 3. The electronic control unit 8 may then in particular control the voltage between the electrical conductor 6a and the electrical conductor 6c and thus purposefully influence the cooling capacity of the Peltier element. ESD protection may likewise be integrated into the electronic control unit 8.

The electronic control unit 8 is integrated monolithically into the carrier 2 for example by photolithographic process steps. The carrier 2 may thus be a silicon chip with integrated circuits. The temperature sensor 7 and/or the semiconductor chip 4 may be adhesively bonded or soldered to the mounting side 20. It is likewise possible for the temperature sensor 7 also to be integrated monolithically into the carrier 2, for instance in the form of a temperature-dependent resistor.

The electronic control unit 8 and semiconductor chip 4 overlap laterally in a direction parallel to the mounting side 20. In this way a compact, particularly space-saving arrangement is achieved. By combining an electronic control unit 8 with a temperature sensor 7, thermal overloading of the optoelectronic component 1 may be prevented.

Alternatively or in addition, the component 1 may also contain a sensor for radiation. By this sensor, radiation from the semiconductor chip 4 or indeed environmental radiation may be detected. By such a sensor, the current supply, in combination with an electronic control unit 8, may be conformed to the respective requirements, thermal loading of the component 1 thereby being reduced.

The apparatus described herein is not restricted by the description given with reference to the examples. Rather, this disclosure encompasses any novel feature and any combination of features, including in particular any combination of features in the appended claims, even if this feature or this combination is not itself explicitly specified in the claims or examples.

The invention claimed is:

1. An optoelectronic component comprising:
a carrier with a mounting side and having at least one functional element,
at least one substrateless optoelectronic semiconductor chip with a top and an opposed bottom is electrically conductive by way of the top and the bottom, wherein the bottom faces the mounting side and the semiconductor chip is mounted on the mounting side, and
at least one structured electrical contact film located on the top.

2. The optoelectronic component according to claim 1, comprising at least four semiconductor chips.

3. The optoelectronic component according to claim 2, in which the functional element comprises electrical conductors such that the semiconductor chips or groups of semiconductor chips are individually drivable.

4. The optoelectronic component according to claim 2, wherein the semiconductor chips are densely packed.

5. The optoelectronic component according to claim 2, wherein each semiconductor chip has a functional element assigned to it and which is located at least partially on the bottom.

6. The optoelectronic component according to claim 1, in which the at least one functional element and the at least one semiconductor chip overlap in a direction parallel to the mounting side.

7. The optoelectronic component according to claim 6, in which the functional element is monolithically integrated into the carrier, is made of p-doped silicon, and comprises at least one n-doped zone.

8. The optoelectronic component according to claim 1, wherein the functional element comprises an active cooling element.

9. The optoelectronic component according to claim 8, wherein the active cooling element is a Peltier element.

10. The optoelectronic component according to claim 1, wherein the functional element comprises electrostatic discharge protection.

11. The optoelectronic component according to claim 1, wherein the functional element comprises at least one sensor for temperature and/or radiation.

12. The optoelectronic component according to claim 1, wherein the functional element comprises an electronic control unit.

13. The optoelectronic component according to claim 12, wherein the electronic control unit is connected to the at least one sensor via a signal line.

14. The optoelectronic component according to claim 1, wherein the at least one semiconductor chip is soldered or adhesively bonded to the carrier.

15. The optoelectronic component according to claim 1, wherein the electrical power consumption of the semiconductor chip, relative to the area of the top, is at least 1 W/mm$^2$.

16. The optoelectronic component according to claim 1, wherein the contact film is made of metal and covers at most 35% of the area of the top.

17. An optoelectronic component including:
a carrier with a mounting side and having at least one functional element;
at least one substrateless optoelectronic semiconductor chip with a top and an opposed bottom and is electrically conductive by way of the top and the bottom, wherein the bottom faces the mounting side and the semiconductor chip is mounted on the mounting side; and
at least one structured electrical contact film on the top, wherein
1) the functional element is monolithically integrated with the carrier,
2) the functional element and the at least one semiconductor chip overlap in a direction parallel to the mounting side, and
3) the functional element is at least one selected from the group consisting of an electrostatic discharge protection, an electronic control unit, a sensor for temperature and/or radiation, and an active cooling element.

\* \* \* \* \*

UNITED STATES PATENT AND TRADEMARK OFFICE
CERTIFICATE OF CORRECTION

PATENT NO. : 8,278,767 B2 Page 1 of 1
APPLICATION NO. : 13/000390
DATED : October 2, 2012
INVENTOR(S) : Gunther et al.

It is certified that error appears in the above-identified patent and that said Letters Patent is hereby corrected as shown below:

<u>In Column 10</u>

At claim 1, line 6, please change "conductive" to --contacted--.

<u>In Column 11</u>

At claim 17, line 6, please change "conductive" to --contacted--.

Signed and Sealed this
Eighteenth Day of December, 2012

David J. Kappos
*Director of the United States Patent and Trademark Office*

UNITED STATES PATENT AND TRADEMARK OFFICE
CERTIFICATE OF CORRECTION

PATENT NO. : 8,278,767 B2  
APPLICATION NO. : 13/000390  
DATED : October 2, 2012  
INVENTOR(S) : Gunther et al.

Page 1 of 1

It is certified that error appears in the above-identified patent and that said Letters Patent is hereby corrected as shown below:

Column 10, line 17

(Claim 1, line 6) please change "conductive" to --contacted--.

Column 11, line 6

(Claim 17, line 6) please change "conductive" to --contacted--.

This certificate supersedes the Certificate of Correction issued December 18, 2012.

Signed and Sealed this  
Nineteenth Day of February, 2013

Teresa Stanek Rea  
*Acting Director of the United States Patent and Trademark Office*